(12) United States Patent
Huisman et al.

(10) Patent No.: US 7,279,702 B2
(45) Date of Patent: Oct. 9, 2007

(54) ELECTRONIC DEVICE, METHOD, MONOMER AND POLYMER

(75) Inventors: Bart-Hendrik Huisman, Eindhoven (NL); Dagobert Michel De Leeuw, Eindhoven (NL); Johan Lub, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 271 days.

(21) Appl. No.: 10/507,342

(22) PCT Filed: Mar. 12, 2003

(86) PCT No.: PCT/IB03/01062

§ 371 (c)(1),
(2), (4) Date: Sep. 10, 2004

(87) PCT Pub. No.: WO03/079400

PCT Pub. Date: Sep. 25, 2003

(65) Prior Publication Data

US 2005/0142894 A1 Jun. 30, 2005

(30) Foreign Application Priority Data

Mar. 15, 2002 (EP) .................................. 02076053

(51) Int. Cl.
*H01L 35/24* (2006.01)
*H01L 51/00* (2006.01)

(52) U.S. Cl. .................. 257/40; 257/40; 257/E51.024; 257/E51.027; 257/E51.005; 438/99

(58) Field of Classification Search ........... 257/40, 257/E51.024, E51.027, E51.005; 438/99
See application file for complete search history.

(56) References Cited

U.S. PATENT DOCUMENTS 5,599,899 A 2/1997 Jenekhe et al.
(Continued)

FOREIGN PATENT DOCUMENTS

GB 2346148 B 6/2002
(Continued)

OTHER PUBLICATIONS

Junzhi Yao et al, "Hyperbranched Poly(2.5 silylthiophenes). The Possibility of Conjugation in Three Dimensions", Organometallics, vol. 18, Sep. 4, 1999, pp. 1736-1740.
(Continued)

*Primary Examiner*—Jerome Jackson
*Assistant Examiner*—Joseph Nguyen
(74) *Attorney, Agent, or Firm*—Paul Im

(57) ABSTRACT

The electronic device of the invention comprises one or more active elements, each comprising a first and a second electrode and an active layer of organic material separating the first and second electrodes. Examples of active elements are thin-film transistors and light-emitting diodes. The active layer comprises a polymeric material having conjugated units A and non-conjugated intermediate units B, which intermediate units B separate the conjugated units A from each other, such that no conjugation extends from a first conjugated unit A1 to a second conjugated unit A2. The polymeric material may be a polymer network, an alternating copolymer or a polymer in which the conjugated units are present in side chains. The polymer can be prepared from monomers having a B1-A1-B2 structure, wherein at least one of B1 and B2 comprises a reactive group enabling polymerization.

8 Claims, 1 Drawing Sheet

Figure 1:
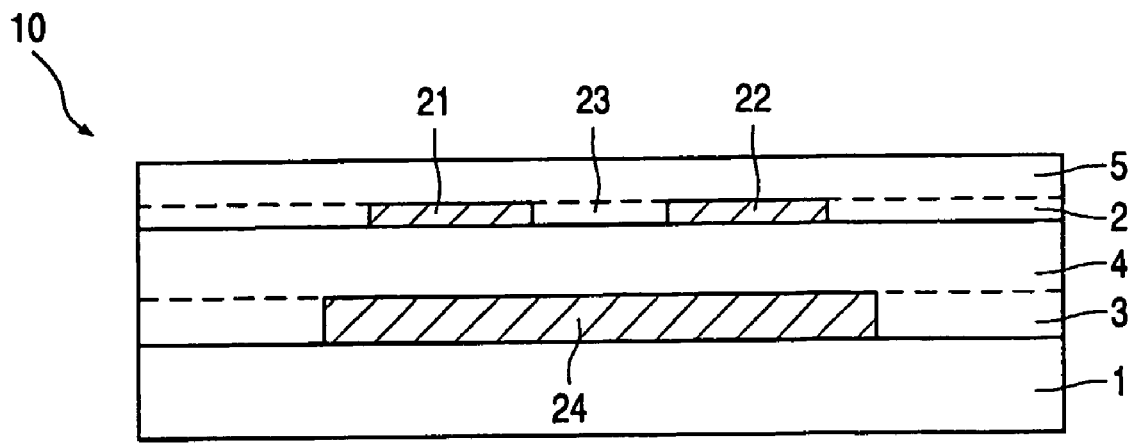

U.S. PATENT DOCUMENTS 6,563,132 B1 * 5/2003 Talroze et al. ............... 257/40
6,949,762 B2 * 9/2005 Ong et al. .................... 257/40

FOREIGN PATENT DOCUMENTS

WO     WO94/15368 A1    7/1994
WO     WO 01/92369 A1    12/2001

OTHER PUBLICATIONS

Y. Ohsedo et al, Synthesis and Electrochromic Properties of Methacrylate Copolymers Containing Pendant Terthiophene and Oligo(ethyleneoxide) Moieties, Synthetic Metals Jun. 1999.

Y. Ohsedo et al, "Synthesis and electrochromic properties of a methacrylate polymer containing pendant terthiophene", Synthetic Metals, vol. 81, 1996, pp. 157-162.

Brown et al, "Field-effect transistors made from solution-processed organic semiconductors", Synthetic Metals, vol. 88, 1997, pp. 37-55.

Sato et al, Soluble polymers with contant pi-conjugation length: polymers containing thiophene tetramers and hexamers, Polymer, vol. 41, 2000, pp. 5681-5687.

* cited by examiner

ELECTRONIC DEVICE, METHOD, MONOMER AND POLYMER

The invention relates to an electronic device provided with an active element having a first and a second electrode, which are separated from each other by an active layer containing a semiconductive or electroluminescent organic material.

The invention also relates to a method of preparing a polymer comprising conjugated conjugation units A and non-conjugated intermediate units B, an intermediate unit $B_1$ mutually separating a first and a second conjugation unit $A_1, A_2$ in such a manner that the conjugation of the first and the second conjugation unit $A_1, A_2$ is interrupted in the intermediate unit $B_1$.

The invention also relates to a monomer and to a polymer.

Such a device is known from, inter alia, WO-A 01/92369. This device comprises an active layer of polyphenylene-vinylene-PPV-, polythienylene-vinylene-PTV- or a similar material. PPV is a material having electroluminescent properties that is employed in display screens with light-emitting diodes as the active elements. PTV is a material having semiconductive properties that is used in transponders and liquid crystalline display screens with transistors as the active elements.

A drawback of the known device resides in that the active layer is very sensitive to oxygen and moisture. This adversely affects the service life of the device unless the device is very well encapsulated. Such an encapsulation is expensive however and adversely affects the flexibility. Devices comprising active layers of an oligomer material that is less sensitive to the influence of air and moisture, such as pentacene, are known from, for example, Brown et al., *Synt. Met.* 88 (1997), 37-55. However such a material is poorly processable from solution, as is also indicated by Brown et al.

Therefore a first object of the invention is to provide an electronic device of the type mentioned in the opening paragraph, the active layer of which has an improved stability with respect to air, light and moisture and is also readily processable from solution.

This first object is achieved in that the organic material of an active layer is a polymer comprising conjugated conjugation units which are separated from each other by non-conjugated intermediate units B in such a manner that the conjugation of the first and the second conjugation unit $A_1$, $A_2$ is interrupted in an intermediate unit $B_1$.

The device comprises an active layer wherein in fact oligomers are incorporated in a polymer matrix. The conjugation of the conjugation units is interrupted by the intermediate units. By conjugation of the conjugated units is meant that delocalized π orbitals are present which spread over various atoms. This forms the basis of the electroluminescent and semiconductive behavior, which is not observed in polymers without conjugation. The localization enables the electrons in the delocalized orbitals to move, which occurs when there is a voltage difference between the first and the second electrode. The mobility is comparatively low because "hopping" between the polymer chains should take place. This explanation is confirmed by the fact that higher mobilities were found for crystalline oligomers. The active layer of the invention shows the electroluminescent and semiconductive behavior as well, even though its conjugation is interrupted.

It has been found that the active layer in the device in accordance with the invention is not, or hardly, sensitive to the influence of light, air and moisture, and that in addition said layer can be readily processed from solution. Besides, by using this active layer an active element is obtained which is sensitive to the voltages applied. In particular, a transistor is obtained which can be turned on and off.

Polymers comprising conjugated conjugation units A and non-conjugated intermediate units B, with an intermediate unit $B_1$ mutually separating a first and a second conjugation unit $A_1, A_2$ in such a manner that the conjugation of the first and the second conjugation unit $A_1, A_2$ is interrupted in the intermediate unit $B_1$ are known per se, for example, from *Polymer* 41 (2000), 5681-5687 and from *Synt. Met.* 81 (1996), 157-162. Said known polymers are only known, however, for their electrochromic properties. Besides, all of the known polymers are doped. In the device in accordance with the invention, however, the organic material is not doped, because doping of the organic semiconducive material is undesirable. This can be elucidated by means of an example of a transistor: at a voltage difference between the first and the second electrode—the source and the drain electrode—a current will flow through the active layer in this element. However, this current can be suppressed by applying a voltage to a third electrode, i.e. the gate electrode. The active layer will then go into a state of depletion, causing the resistance of the active layer to increase substantially. Owing to the presence of charge carriers due to the doping, it is no longer possible, however, to suppress current in the active layer by means of said gate electrode.

The intermediate units and the conjugation units in the polymeric material of the active layer can be distributed in various ways. The polymer may be a polymer network comprising a first and second main chains which are interconnected via side chains, a side chain containing a $B_1$-$A_1$-$B_2$ structure, with $B_1$, $B_2$ being intermediate units and Al being a conjugation unit. Such a polymer network can be prepared from monomers with a $B_1$-$A_1$-$B_2$ structure, wherein both intermediate units $B_1$, $B_2$ contain a reactive group. The reactive group, such as an acrylLate or an epoxide, can react with a reactive group in the polymer that is used for the main chain. Alternatively, the polymerization in the main chain may take place during or after the formation of the side chains. A polymer network has the advantage that it can be excellently structured.

Alternatively, the polymer may be a copolymer comprising a main chain, the intermediate units B and the conjugation units A being present in the main chain as alternating units . . . -$A_1$-$B_1$-$A_2$-$B_2$- . . . . This copolymer has the advantage, inter alia, that it can be readily processed and that it enables p-type and n-type-conjugated units to be combined.

It is additionally possible for the polymer to comprise a main chain with side chains, a side chain containing a $B_1$-$A_1$-$B_2$- structure, wherein $B_1$, $B_2$ are intermediate units and $A_1$ is a conjugation unit. This type of polymer has the advantage that it permits a high mobility. If there is sufficient flexibility in the intermediate units $B_1$, $B_2$ and steric hindrance between the different conjugation units $A_1$ is substantially or completely precluded, the chains may become ordered relative to each other. As a result of said increased degree of order, the distance between neighboring polymer chains is reduced and hence there is a lower energy barrier for "hopping" of electrons from a first to a second chain, with the accompanying increase in mobility.

Advantageously, the intermediate unit $B_1$ comprises a mesogenic group. Mesogenic groups are known per se and comprise, for example, cyano or alkoxy biphenyl groups which are coupled by an ether or an ester group to an atom. The advantage of such mesogenic groups is that they exhibit liquid crystalline behavior. This enables the conjugation units to be aligned. By means of a subsequent cross-linking operation, the mesogenic groups are fixed in the desired position with the desired order of the aligned conjugation units. However, it has surprisingly been found that the bisacrylates themselves show liquid crystalline behavior already, even without the presence of additional mesogenic groups, if the alkyl chain in the 'intermediate unit' $B_1$, $B_2$ has a chain length of 6 or more, i.e. the alkyl chain is hexyl, heptyl, octyl, or longer. The liquid crystalline properties indicate that higher-order phases can be obtained for these compounds and hence a higher mobility can be achieved.

In principle, each oligomeric unit can suitably be used as a conjugation unit. Examples thereof are given in Katz et al., Acc. Chem. Res. 34 (2001), 359-369. The conjugation units may be n-type conductive or p-type conductive. Suitable conjugation units are, inter alia, units of formula $Y_n$, wherein $2 \leq n \leq 8$ and Y is selected from the group

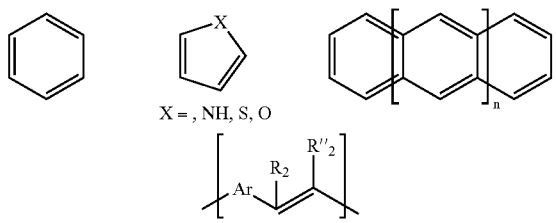

wherein

Ar is an aromatic ring system with 4 to 6 carbon atoms that may be substituted with a substituent selected from the group composed of an unbranched $C_1$-$C_{20}$-alkyl-, $C_3$-$C_{20}$-alkoxy-, $C_1$-$C_{20}$-alkyl sulfate-, a branched $C_3$-$C_{20}$-alkyl-, phenyl or benzyl or alkaryl or aralkyl group, and that may comprise up to 4 heteroatoms selected from the group composed of oxygen, sulfur and nitrogen in the aromatic ring system, and $R_2$ and $R_{12}$ are selected from the group composed of a hydrogen atom and a $C_1$-$C_{20}$alkyl- and a $C_4$-$C_{20}$-aryl group, and alkaryl and aralkyl groups which groups may contain substituents.

Particularly suitable examples of said conjugation units are units on the basis of thienyl and phenyl groups comprising 3-6 groups per unit. Such units correspond to oligomers such as sexithiophene and pentacene. Any further side chains may be chosen and used to improve the solubility and further properties, as is known the skilled person. Such sidechains might further be functionalized.

Intermediate units are preferably alkyl groups with a chain length of the order of 4-20 units. Alternatively phenyl groups, toluyl-, benzyl- and other alkaryl and aralkyl groups can be applied. It is favorable for the chain length of the intermediate units to fairly correspond to the chain length of an adjoining conjugation unit. The chain length is an optimum between the processability and stability requirements. It is not necessary for all intermediate units to have the same chain length; on the contrary, in the case of a polymer in which the conjugation units are mainly present in side chains, it is advantageous if there is some spread in the chain length of the intermediate units. This spread precludes steric hindrance. The intermediate units may comprise customary side chains to influence solubility and reactivity. Measurements of characteristics of transistors comprising the monomer units as semiconductor material show that the length of the alkyl spacer group has a minor effect on the transistor characteristics. The characteristics improve slightly with increasing spacer length. However, from a theoretical point of view, this appears to be bound to a maximum; the conjugated oligomer parts $A_1$ of the molecules should be in contact with other oligomer groups $A_1$, $A_x$, particularly in other molecules, to allow movement of charge carriers through the material.

Reactive end groups at the intermediate units may lead to polymerization. Dependent upon the type of end group, radical polymerization, anionic or cationic polymerization or condensation polymerization may take place. In the case of condensation polymerization, for example, a mixture of bisalcohols and bisacrylic acids is polymerized. An example of a suitable end group is R—O—C(O)—$CH_2$=$CH_2$, wherein R indicates the alkyl residue of the intermediate unit. The attachment of an acrylate group apparently does not dramatically affect the semiconductor properties of the monomer units, even though oxygen atoms, which are rich in electrons, are introduced into the molecule. In comparison with bisalcohols, the use of bisacrylates leads to a slight decrease in mobility but a substantial increase in modulation.

In a further embodiment of the device in accordance with the invention, a second active element is present, which contains a first and a second electrode which are mutually separated by the active layer. In said second active element, the active layer has a relief structure, so that the active layer between the first and the second active element is removed. Such a relief structure can favorably be used to preclude leakage currents through the active layer between neighboring transistors. The application of such a relief structure is highly preferred in the case of a liquid crystalline display screen with transistors as active elements. Structuring may take place in a customary manner by applying a resist layer, providing this resist layer with a desired pattern by means of photolithography and etching the active layer. Such a method may however put the properties of the active layer at risk. Therefore, it is more favorable to provide the active layer by means of a printing technique. Alternatively, the polymer can be obtained by photopolymerization of the organic material. In a suitable embodiment, a photoinitiator is added to the solution of the monomer that has been derived from the semiconducting monomer. Polymerization was initiated photochemically by exposing the monomer layer to patterned radiation through a mask. Subsequent development of the layer resulted in a structured layer. For the development use is preferably made of the solvent of the monomer. The resolution of the patterns is of the order of micrometers.

A method of the type mentioned in the opening paragraph is disclosed, inter alia, in Ohsedo et al., Synt. Met. 81 (1996), 157-162. In the known method, a polymer is formed in which the conjugation units—terthiophene—are present in the side chains.

A drawback of said method resides in that it is sensitive to the coupling of two conjugation units.

Therefore, a second object of the invention is to provide a different method of the type mentioned in the opening paragraph.

This object is achieved in that the polymer is prepared from a monomer having a $B_1$-$A_1$-$B_2$ structure, wherein at least one of the groups $B_1$, $B_2$ comprises a reactive end group. In the method in accordance with the invention, a monomer is applied wherein the conjugation unit is present in a center part. As a result, the reactivity of the monomer is largely determined by the intermediate units $B_1$ and $B_2$.

In principle, each oligomeric unit can suitably be used as a conjugation unit. Examples thereof are given in Katz et al., *Acc. Chem. Res.* 34 (2001), 359-369. The conjugation units may be n-type conductive or p-type conductive. In a favorable embodiment use is made of a monomer having a $B_1$-$A_1$-$B_2$ structure, wherein $A_1$ is a conjugated unit having the formula $Y_n$, wherein $2 \leq n \leq 8$ and Y is selected from the group formed by

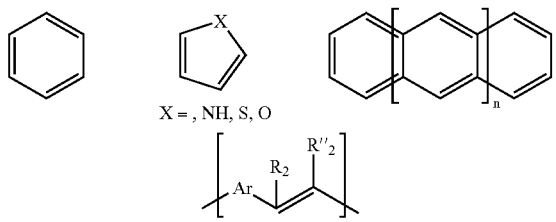

wherein
Ar is an aromatic ring system with 4 to 6 carbon atoms that may be substituted with a substituent selected from the group composed of an unbranched $C_1$-$C_{20}$-alkyl-, $C_3$-$C_{20}$-alkoxy-, $C_1$-$C_{20}$-alkyl sulphate-, a branched $C_3$-$C_{20}$-alkyl-, phenyl- or benzyl group, and that may contain up to 4 heteroatoms selected from the group composed of oxygen, sulfur and nitrogen in the aromatic ring system, and
$R_2$ and $R''_2$ are selected from the group composed of a hydrogen atom and a $C_1$-$C_{20}$-alkyl- and a $C_4$-$C_{20}$-aryl group, which groups may comprise substituents, and wherein $B_1$, $B_2$ are non-conjugated groups.

Figure 2:
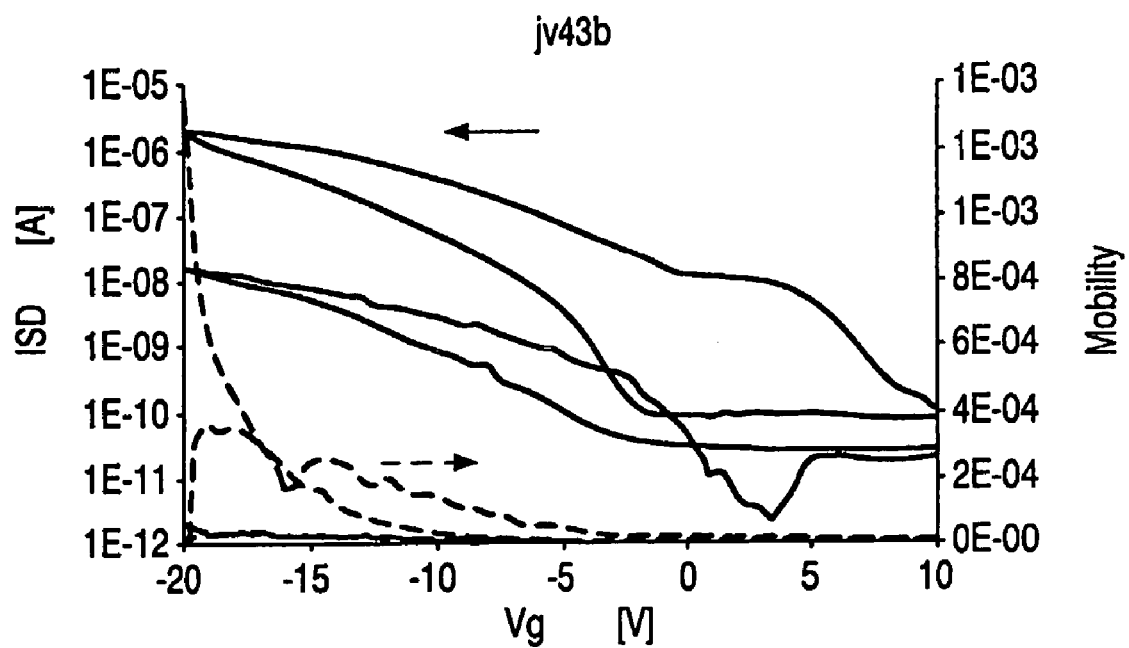

These and other aspects of the invention will be explained in greater detail with reference to an embodiment and a drawing, wherein:

FIG. 1 is a diagrammatic sectional view of a first embodiment of the device; and FIG. 2 shows the characteristic of a transistor as shown in FIG. 1.

EMBODIMENT 1

Synthesis of 2,2'''-bis(6-acryloyloxyhexyl)quaterthiophene

A quantity of 0.38 g (4.2 mmol) acryloic acid was added to a mixture of 1.0 g (1.9 mmol) of bisalcohol 2,2'''-bis(6-hydroxyhexyl)quaterthiophene and 0.5 g (4.2 mmol) dimethylaniline in 27 ml of dichloromethane at 0° C. in an inert atmosphere. The mixture was allowed to heat up to room temperature and stirred overnight. The resulting solution was filtered and washed with dichloromethane. The remaining dimethylaniline was extracted with hydrochloric acid, and the organic phase was washed with a saturated solution of sodium chrlodide. It was dried over magnesium sulphate and filtered through a layer of silica gel after which the solvent was evaporated. The orange product was washed with ethanol and dried overnight in a desiccator. It was identified as 2,2'''-bis(6-acryloyloxyhexyl) quaterthiophene. The yield was 0.35 g (35%).

EMBODIMENT 2

The bisacrylate derivative as prepared in embodiment 1 was spin-coated onto a test substrate wherein electrodes were already provided. An initiator (Irgacure) was added as the additive. A good film was obtained which was subsequently polymerized in situ by means of photopolymerization. It was found that the transistor was stable in air and light. Transistor characteristics are shown in FIG. 2 wherein the current between source and drain electrode ISD and the mobility are plotted against the voltage on the gate electrode $V_g$. The specific mobility of this material is $10^{-5}$ cm$^2$ Vs.

EMBODIMENT 3

The thin-film transistor 10 shown in FIG. 1 comprises an electrically insulating substrate 1 on which a first electrode layer 2 is provided. In this layer 2, a source electrode 21 and a drain electrode 22 are defined, which electrodes 21, 22 are mutually separated by a channel 23. A second electrode layer 3 wherein a gate electrode 24 is defined is also present on the substrate 1. If the gate electrode 24 is perpendicularly projected onto the first electrode layer 2 then the gate electrode 24 and the channel 23 demonstrate a substantial overlap. In addition, an intermediate layer 4 and an active layer 5 are present.

Said layers 2, 3, 4, 5 are present on the substrate 1 in the following sequence: second electrode layer 3, intermediate

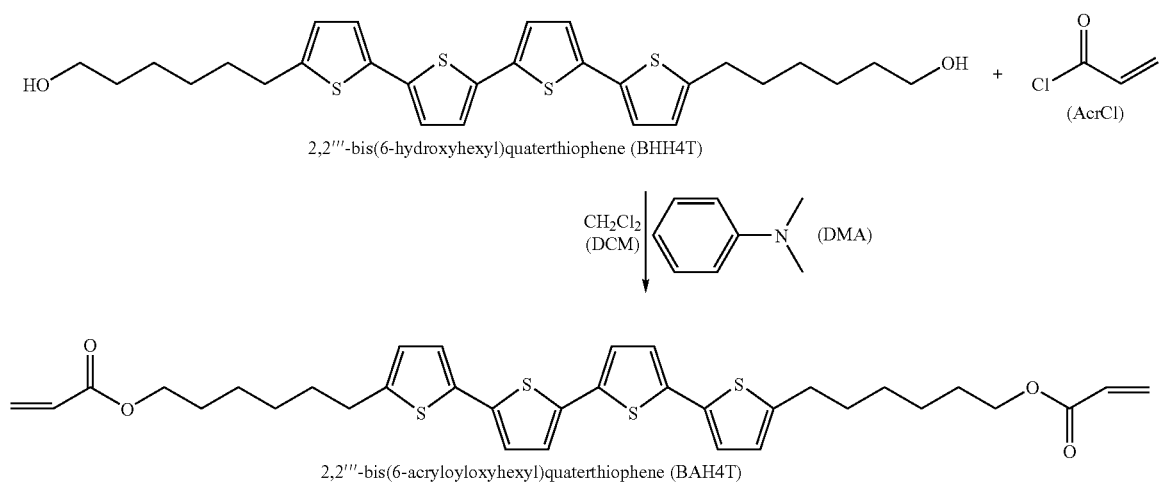

layer 4, first electrode layer 2 and active layer 5. To planarize the substrate, an insulating planarization layer of polyvinyl alcohol (not shown) is present. The second electrode layer 3 contains Au and is provided in accordance with a desired pattern in known manner by means of an exposed and developed photosensitive resist. Between the second electrode layer 3 and the intermediate layer 4, there is provided a monolayer (not shown) of $CH_3$—$(CH_2)_{15}$—SH to preclude pinholes in the intermediate layer 4. The intermediate layer 4 comprises a photostructurable organic dielectric, such as benzocyclobutene, polyimide, polyvinyl phenol or a photoresist, in this case the photoresist HPR504. The first electrode layer 2 comprises, in this case, poly(3,4-ethylene dioxythiophene) and a polystyrene sulfhonic acid. The first electrode layer 2 is provided by means of spin-coating and structured by exposure to light.

The active layer 5 is spin-coated in a thickness of 50 nm onto the first electrode layer 2. The active layer 5 comprises a polymer network having quaterthiophene as the conjugation unit, and is prepared as indicated in example 1. The weight ratio between the carrier material and the semiconductor is 1. At least a part of the semiconductor layer 5 is present in the channel 23.

The invention described herein may be applied in different variants and yields a device comprising an active layer which is not, or hardly, sensitive to the influence of light and air. Active layers can be prepared in accordance with the invention. It is additionally possible for the active layer to be mixed with a carrier polymer, as described in the non-prepublished application EP01203720.6 (NL010691).

EMBODIMENT 4

A quantity of 0.84 g (9.3 mmol) acryloic acid was added to a mixture of 2.0 g (4.2 mmol) of the bisalcohol 2,2'''-bis (6-hydroxybutyl)quaterthiophene and 1.1 g (9.3 mmol) dimethylaniline in 50 ml of dichloromethane at 0° C. in an inert atmosphere. The mixture was allowed to heat up to room temperature and was stirred overnight. The resulting solution was filtered, washed with, in succession, hydrochloric acid and brine, dried over magnesium sulphate and filtered through a layer of silica gel after which the solvent was evaporated. The orange product was washed with ethanol and dried overnight in a desiccator. It was identified as 2,2'''-bis(6-acryloyloxybutyl)quaterthiophene. The yield was 2.019 g (82.4%).

Films were prepared by spin-coating a 0.5 weight % solution of oligothiophene in chloroform at a rate of 500 rpm for 30 seconds. The photoinitiator Irgacure was added to the solution for photopolymerization experiments in a quantity of 5% of the oligothiophene. Transistor measurements were performed immediately after the preparation, using a HP 4564B semiconductor analyzer in air and light.

EMBODIMENT 5

In order to measure the effect of the acrylate groups and the polymerization, transistor characteristics, particularly the mobility (in $cm^2/Vs$) and the modulation were measured. The results obtained are shown in Table 1. The decrease in modulation in the monoacrylate polymer appears to be due to initiator residues from thermal initiation, or to non-optimized heating.

TABLE I modulation and mobility as a function of monomer and polymer structure.

| monomer or polymer | alkyl group or spacer | end group | mobility ($cm^2/Vs$) | modulation ($I_{vd,on}/I_{vd,off}$) |
|---|---|---|---|---|
| monomer | butyl | bisalcohol | $5 \cdot 10^{-3}$ | 600 |
| monomer | hexyl | bisalcohol | $2 \cdot 10^{-2}$ | 1000 |
| monomer | butyl | bisacrylate | $3 \cdot 10^{-4}$ | $10^5$ |
| monomer | hexyl | bisacrylate | $4 \cdot 10^{-3}$ | $10^5$ |
| polymer (network) | hexyl | acrylate | $5 \cdot 10^{-4}$ | $10^5$ |
| monomer | hexyl | monoacrylate | $5 \cdot 10^{-4}$ | $10^5$ |
| polymer (oligomer in side chain) | hexyl | acrylate | $4 \cdot 10^{-5}$ | $10^4$ |

The invention claimed is:

1. An electronic device provided with an active element having a first electrode and a second electrode, which are separated from each other by an active layer containing a semiconductive or electroluminescent organic material, wherein the organic material of the active layer is a polymer comprising conjugated conjugation units which are separated from each other by non-conjugated intermediate units B in such a manner that the conjugation of first and second conjugation units $A_1$, $A_2$ is interrupted in an intermediate unit $B_1$, and wherein the active layer comprises an intrinsic, undoped semiconductive material, wherein the polymer comprises a main chain with side chains, a side chain containing a $B_1$-$A_1$-$B_2$- structure, wherein $B_1$, $B_2$ are intermediate units and $A_1$ is a conjugation unit.

2. The electronic device as claimed in claim 1, wherein the polymer includes a polymer network comprising first and second main chains which are interconnected via the side chains.

3. The electronic device as claimed in claim 1, wherein the polymer includes a copolymer comprising a copolymer chain, the intermediate units B and the conjugation units A being present in the copolytner chain as alternating units . . . -$A_1$-$B_1$-$A_2$-$B_2$- . . . .

4. The electronic device as claimed in claim 1, wherein the intermediate unit $B_1$ comprises a mesogenic group.

5. The electronic device as claimed in claim 1, wherein the conjugation unit is a unit of formula $Y_n$, wherein $2 \leq n \leq 8$ and Y is selected from the group composed of

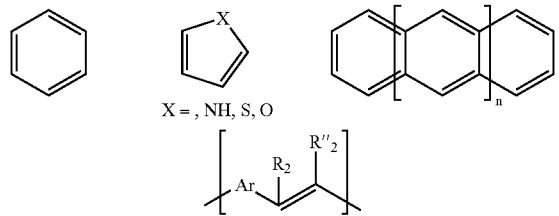

wherein
Ar is an aromatic ring system with 4 to 6 carbon atoms that may be substituted with a substituent selected from the group composed of an unbranched $C_1$-$C_{20}$-alkyl-, $C_3$-$C_{20}$-alkoxy-, $C_1$-$C_{20}$-alkylsulphate-, a branched $C_3$-$C_{20}$-alkyl-, phenyl or benzyl group, and that may comprise up to 4 heteroatoms selected from the group composed of oxygen, sulfur and nitrogen in the aromatic ring system, and $R_2$ and $R''_2$ are selected from the group composed of a hydrogen atom and a $C_1$-$C_{20}$alkyl- and a $C_4$-$C_{20}$-aryl group, which groups may comprise substituents.

6. The electronic device as claimed in claim 1, wherein the active element is a transistor and wherein a third electrode is present which is separated from the active layer by a dielectric.

7. A monomer having a $B_1$-$A_1$-$B_2$ structure, wherein $A_1$ is a conjugated unit of formula $Y_n$, wherein $2 \leq n \leq 8$ and Y is selected from the group composed of

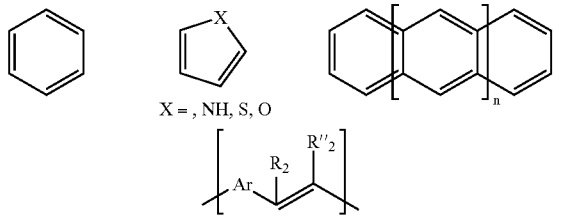

wherein

Ar is an aromatic ring system with 4 to 6 carbon atoms that may be substituted with a substituent selected from the group composed of an unbranched $C_1$-$C_{20}$-alkyl-, $C_3$-$C_{20}$-alkoxy, $C_1$-$C_{20}$-alkylsulphate-, a branched $C_3$-$C_{20}$-alkyl-, phenyl or benzyl group, and that may comprise up to 4 heteroatoms selected from the group composed of oxygen, sulfur and nitrogen in the aromatic ring system, and $R_2$ and $R''_2$ are selected from the group composed of a hydrogen atom and a $C_1$-$C_{20}$alkyl- and a $C_4$-$C_{20}$-aryl group, which groups may comprise substituents, wherein $B_1$, $B_2$ are non-conjugated groups, and wherein the monomer forms an intrinsic, undoped semiconductive material of an active layer of an electronic device, the active layer including first and second electrodes.

8. A polymer comprising:

conjugated conjugation units A and non-conjugated conjugation units B;

an intermediate unit $B_1$ mutually separating a first and a second conjugation units $A_1$, $A_2$ in such a manner that conjugation of the first and a second conjugation units $A_1$, $A_2$ is interrupted in the intermediate unit $B_1$, wherein the polymer is prepared from a monomer having a $B_1$-$A_1$-$B_2$ structure, and wherein at least one of the groups $B_1$, $B_2$ comprise a reactive end group, and wherein the polymer comprises an intrinsic, undoped semiconductive material and forms an active layer of an electronic device, the active layer including first and second electrodes.

* * * * *